United States Patent [19]

Kanamori

[11] Patent Number: 5,281,850
[45] Date of Patent: Jan. 25, 1994

[54] SEMICONDUCTOR DEVICE MULTILAYER METAL LAYER STRUCTURE INCLUDING CONDUCTIVE MIGRATION RESISTANT LAYERS

[75] Inventor: Jun Kanamori, Tokyo, Japan

[73] Assignee: Oki Electric Industry Co., Ltd., Tokyo, Japan

[21] Appl. No.: 922,774

[22] Filed: Jul. 31, 1992

[30] Foreign Application Priority Data

Aug. 7, 1991 [JP] Japan ................. 3-198082

[51] Int. Cl.$^5$ .............................. H01L 29/40
[52] U.S. Cl. ................... 257/758; 257/767; 257/915
[58] Field of Search .............. 257/751, 758, 759, 767, 257/915, 765, 763; 437/189, 192, 194

[56] References Cited

U.S. PATENT DOCUMENTS

| | | | |
|---|---|---|---|
| 4,556,897 | 12/1985 | Yorikane | 257/763 |
| 4,970,574 | 11/1990 | Tsunenari | 257/759 |
| 5,081,064 | 1/1992 | Inoue et al. | 437/194 |
| 5,151,772 | 9/1992 | Takahashi et al. | 257/758 |

FOREIGN PATENT DOCUMENTS

| | | | |
|---|---|---|---|
| 0192140 | 8/1989 | Japan | 437/194 |
| 0122050 | 4/1992 | Japan | 257/763 |

*Primary Examiner*—Rolf Hille
*Assistant Examiner*—Peter Toby Brown
*Attorney, Agent, or Firm*—Wenderoth, Lind & Ponack

[57] ABSTRACT

A multilevel metallization structure for a semiconductor device having an antireflective film and a migration resistant film. The antireflective film is formed on a lower metallization and an dielectric inter-level film is formed on the antireflective film. The dielectric inter-level film has an opening hole for exposing the surface of the lower metallization. The migration resistant film is formed on the dielectric inter-level film and the surfaces of side walls of the opening hole. The upper metallization is formed on the migration resistant film and inside the opening hole so as to directly connect to the lower metallization.

9 Claims, 1 Drawing Sheet

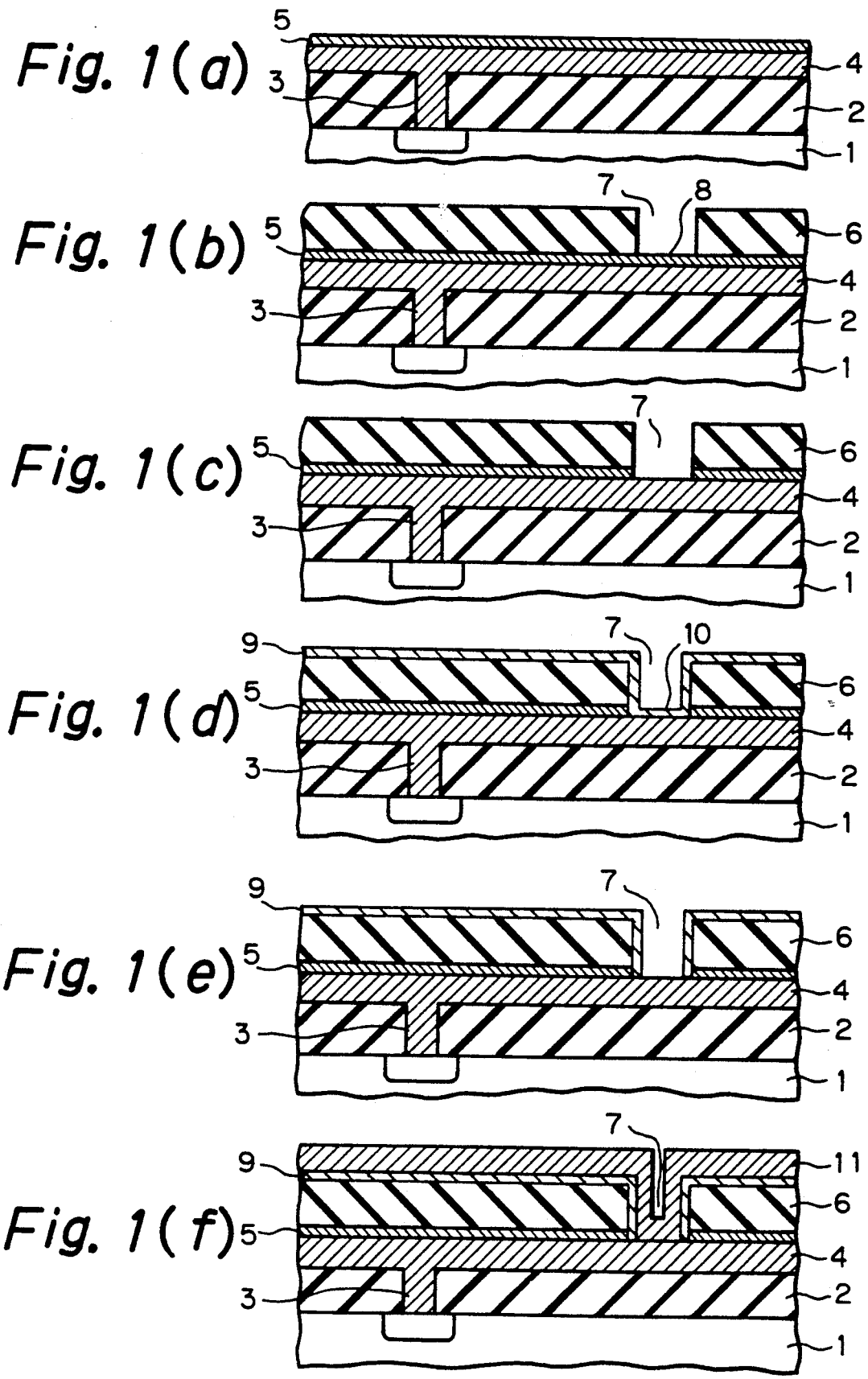

SEMICONDUCTOR DEVICE MULTILAYER METAL LAYER STRUCTURE INCLUDING CONDUCTIVE MIGRATION RESISTANT LAYERS

BACKGROUND OF THE INVENTION

1. Field of the Invention

The present invention relates to a multilevel metallization structure and a method for manufacturing the same adapted for a semiconductor integrated circuit device.

2. Related Art

Recently, integrated circuit devices constituting a semiconductor memory, a microcomputer, etc. have been remarkably increased in integration density of the elements thereof, thereby enabling the semiconductor memory and the microcomputer to improve their electric performance.

A fine patterning technology plays an important role in the process of integration and recently requires an IC design in accordance with a 0.5 μm design rule. Most of the large-scale integrated circuit devices adopt a multilevel metallization structure having fine metallizations.

Whereupon, if the metallization becomes more fine, there is a likelihood of generating metallization breakage because of the occurrence of stress migration or electromigration so that the metallizations have a multilevel metallization structure composed of different conductive material levels to thereby maintain a reliability. For example, a level formed of TiN, TiW or WSi is laid under an Al metallization as an migration resistant level.

In a double-level metallization structure, since the Al metallization has a high reflectance, the accuracy of a metallization patterning made by a photolithographic technology is deteriorated, which leads to the occurrence of a bridge phenomenon in which a bridge is formed across Al metallizations, spaced away from one another on the same level surface, or a notch phenomenon in which the width of the metallization is partially narrowed.

Accordingly, in order to reduce the reflectance of the Al metallization, there is formed on antireflective film, composed of e.g. TiN, TiW, WSi and W or Ti, on the Al metallization.

Accordingly, a triple-level metallization structure has been proposed recently as a multilevel metallization structure. However, if such triple-level metallization structure is employed by the multilevel metallization structure, there is a problem with the metallization interconnection resistance at an opening hole where upper and lower metallizations are connected to each other. This problem adversely influences the operation speed of the integrated circuit. There is another problem in the conventional multilevel metallization structure that the upper metallization is liable to peel off at the portion where the upper and lower metallizations are connected to each other.

SUMMARY OF THE INVENTION

It is an object of the present invention to provide a multilevel metallization structure capable of reducing electric interconnection resistance in an interconnection portion where the upper and lower metallizations are connected to each other and of preventing the upper metallization from peeling off at an opening hole where the upper and lower metallizations are connected to each other.

It is another object of the present invention to provide a method of forming the multilevel metallization structure set forth above.

The multilevel metallization structure of the first aspect of the present invention is characterized by a dielectric layer formed on a semiconductor substrate, a lower metallization formed on the surface of the dielectric layer, an antireflective film formed on the surface of the lower metallization, an dielectric inter-level film formed on the surface of the antireflective film, the dielectric inter-level film having an opening hole for exposing a surface of the metallization, a migration resistant film formed both on the surface of the dielectric inter-level film and the side walls of the opening hole, and an upper metallization formed on both the migration resistant film and the side walls of the opening hole, the upper metallization in the opening hole being directly in contact with the lower metallization.

The method of forming the multilevel metallization structure of the second aspect of the present invention is characterized by the steps of preparing a semiconductor substrate having a dielectric layer on the surface thereof, forming a lower metallization on the dielectric layer, forming the antireflective film on the lower metallization, forming a dielectric inter-level film on the antireflective film, selectively removing the dielectric inter-level film and the antireflective film to thereby form an opening hole to which the surface of the lower metallization is exposed, forming a migration resistant film on the dielectric inter-level film and in the opening hole, selectively removing the migration resistant film in the opening hole to which the surface of the lower metallization is exposed and forming an upper metallization on the surface of the migration resistant layer and in the opening hole so as to directly contact with the lower metallization.

BRIEF DESCRIPTION OF THE DRAWINGS

FIGS. 1(a) to 1(f) are cross-sectional views showing processes for forming a multilevel metallization structure of a semiconductor device according to the present invention.

DESCRIPTION OF THE PREFERRED EMBODIMENT

A multilevel metallization structure and a method of manufacturing the same according to the present invention will be described with reference to FIGS. 1(a) to 1(f).

In FIG. 1(a), there is prepared a semiconductor substrate 1 having thereon elements such as a transistor and a capacitor. A first dielectric inter-level film 2 is formed on the substrate 1 by a known CVD (Chemical Vapor Deposition) process and then an opening hole 3 is formed in the inter-level film 2. An aluminum (Al) alloy film 4, which is composed of 98.9% Al, 0.8% Si and 0.3% Cu and serves as a lower metallization level, is formed on the first dielectric inter-level film 2 and on the substrate 1 by way of the opening hole 3 by a sputtering process in the thickness of 4000 to 5000 Å at the deposition rate of 1.0 μm/min in the atmosphere of Ar where a substrate temperature is in the range of 150° to 200° C., pressure is in the range of 2 to 5 m Torr and a DC power is in the range of 10 to 15 KW.

A TiN film 5 serving as an antireflective film is formed on the Al alloy film 4 by a sputtering process in the thickness of about 500 to 1000 Å at the deposition rate of 750 Å/min on condition that the substrate temperature is in the range of 25° to 200° C., pressure is in the range of 2 to 5 m Torr and the DC power is in the range of 3 to 10 KW. Thereafter, the Al alloy film 4 and the TiN film 5 are subjected to a dry etching. The dry etching is performed by an ECR (Electron Cyclotron Resonance) etcher on condition that $BCl_3$ is 60 sccm (standard cubic centimeter/min), $Cl_2$ is 90 sccm, a microwave power is 300 mA, and an RF power is 70 W. At this time, the migration resistant metal film need not be formed under the Al alloy film 4.

In FIG. 1(b), a CVD film serving as a second dielectric inter-level film is successively formed on the TiN film 5. That is, a BPSG (Boron Phosphorus Silicate Glass) film 6 is formed on the entire surface of the TiN film 5 by a normal pressure $O_3$ TEOS (Tetra Ethyl Ortho Silicate) CVD process in the thickness of 5000 to 7000 Å at the deposition rate of 1800 Å/min on condition that the TEOS is 3 l/min, TMOP (Tri Methoxi Phosphate) serving as a P source is 2.1 l/min, TEB (Tri Ethoxi Borate) serving as a B source is 1.5 l/min, oxygen gas is 7.5 l/min including $O_3$ (100 g/m$^3$), $N_2$ serving as a carrier gas is 18 l/min under an atmospheric pressure, at a substrate temperature is 400° C. A mask is formed by a known photolithographic process. An opening hole 7 is formed after the BPSG film 6 is subjected to an etching on condition that $CF_4$ is 60 sccm, $CHF_3$ is 60 sccm, Ar is 800 sccm, the RF power is 800 W, the pressure is 1.7 m Torr, the substrate temperature is 10° C. and the etching rate is 7000 Å/min.

In FIG. 1(c), the antireflective film 8 exposed to the opening hole 7 is etched by a RIE (Reactive Ion Etching) mode on condition that $SF_6$ is 30 sccm, $O_2$ is 5 sccm, the RF power is 160 W, the pressure is 0,21 m Torr. A gas employed by the etching may be chlorine group gas ($Cl_2$, $BCl_3$, $SiCl_4$, etc.), bromine group gas (HBr, $BBr_3$, etc.) or these gases mixed with an insert gas (Ar, He, etc.).

In FIG. 1(d), a TiN film 9 serving as the migration resistant film for an upper metallization is formed on the BPSG film 6 and in the opening hole 7 by the sputtering process in the thickness of 1000 to 1500 Å. In this sputtering process, the TiN film covers side walls and a bottom surface 10 of the opening hole 7 only to one-third to one-fifth of the thickness of the remaining portion i.e. the BPSG film 6.

In FIG. 1(e), the etching is completed when the surface of the Al alloy film 4 serving as the lower metallization is exposed to the bottom portion 10 of the opening hole 7 after the entire surface of the TiN film 9 is etched back by the RIE mode. As a result, the thickness of the TiN film 9 remains in the thickness of 500 to 1000 Å at the portion other than the bottom portion 10 of the opening hole 7. Furthermore, the TiN film 9 remains on the side walls of the opening hole 7 without being removed therefrom.

If the TiN film 9 is not formed on the side walls of the opening hole 7, gas is released from the side walls of the opening hole 7 at the time of formation of the upper metallization. If the gas is released, the adhesion of the upper metallization to the side walls of the opening hole 7 is weakened, which causes the upper metallization to be peeled off from the side walls of the opening hole. When the TiN film 9 is formed on the side walls of the opening hole, gas is prevented from releasing, which prevents the upper metallization from being peeled off.

In FIG. 1(f), an Al alloy film 11 serving as the upper metallization (composed of 98.9% Al, 0.8% Si and 0.3% Cu) is formed in the thickness of 4000 to 5000 Å on the entire surface of the TiN film 9 and the surface of the part of the Al alloy film 4. The Al alloy film 11 is processed in a desired pattern by the photolithographic process and the etching process. In the thus manufactured multilevel metallization structure, the Al alloy lower level film 4 directly contacts the Al alloy upper level film 11, whereby the resistance value is stable and low.

In the process according to the present invention, as the method of removing the antireflective film 8 exposed to the bottom surface 10 of the opening hole 7, it is possible to remove the antireflective film 8 by subjecting it to a continuous etching process before the etching mask is removed at the time of forming the opening hole 7. Even if the antireflective film 8 comprises other materials such as TiW, WSi, W, Ti, etc., it can be likewise removed.

Although the preferred embodiment is applied to the double-level metallization structure, it is a matter of course that the present invention can be applied to the multilevel metallization structure such as the triple-level metallization structure, quadri-level metallization structure, etc. Particularly, according to the preferred embodiment, both the antireflective film and the migration resistant film are removed but one of these films can be removed by the method of the present invention.

What is claimed is:

1. A semiconductor device having multilevel metal layers, comprising:
    a semiconductor substrate;
    a first insulating layer formed on the semiconductor substrate;
    a first metal layer formed on the first insulating layer, wherein a surface of said first metal layer which is opposite said first insulating layer includes a contact surface region and a non-contact surface region surrounding the contact surface region;
    a first conductive migration resistant layer formed on the non-contact surface region of the first metal layer;
    a second insulating layer formed on the first conductive migration resistant layer and having a contact hole formed therein over the contact surface region of the first metal layer, the second insulation layer having a flat surface which is opposite said first conductive migration resistant layer and at least a part of which is located over the non-contact surface region of the first metal layer and having a side surface extending along and defining the contact hole;
    a second conductive migration resistant layer formed on the flat surface and the side surface of the second insulation layer; and
    a second metal layer formed on the second conductive migration layer and the contact surface region of the first metal layer so as to electrically connect the first and second metal layers at the contact surface region of the first metal layer.

2. A semiconductor device according to claim 1, wherein said first and second metal layers respectively consist of an aluminum alloy material.

3. A semiconductor device according to claim 1, wherein said first and second conductive migration resistant layers respectively consist of TiN.

4. A semiconductor device according to claim 1, wherein said first and second conductive migration resistant layers consist of the same material.

5. A multilevel metal layer structure of a semiconductor device, comprising:
a semiconductor substrate;
a first dielectric film formed on the semiconductor substrate;
a first metal film formed on the first dielectric film, wherein a surface of said first metal film which is opposite said first dielectric film includes a contact surface region and a non-contact surface region surrounding the contact surface region;
an antireflective film having conductivity and migration resistant properties formed on the non-contact surface region of the first metal film, said antireflective film having a surface;
a second dielectric film formed on the surface of said antireflective film and having a contact hole formed therein over the contact surface region of the first metal film, the second dielectric film having a flat surface which is opposite to and substantially parallel to the surface of said antireflective film and a side surface extending along and defining the contact hole;
a conductive migration resistant film formed on the flat surface and the side surface of the second dielectric film; and
a second metal film formed on the conductive migration resistant film and the contact surface region of the first metal film so as to electrically contact the first and second metal films at the contact surface region of the first metal film.

6. A multilevel metal layer structure of a semiconductor device according to claim 5, wherein said first and second metal films consist of an aluminum alloy material respectively.

7. A multilevel metal layer structure of a semiconductor device according to claim 5, wherein said antireflective film consists of a member selected from the group of TiN, TiW, WSi, W and Ti.

8. A multilevel metal layer structure of a semiconductor device according to claim 5, wherein said conductive migration resistant film consists of TiN.

9. A multilevel metal layer structure of a semiconductor device according to claim 5, wherein said antireflective film and said conductive migration resistant film consist of the same material.

* * * * *